(12) United States Patent
Hsieh et al.

(10) Patent No.: US 11,809,665 B2
(45) Date of Patent: Nov. 7, 2023

(54) ELECTRONIC DEVICE

(71) Applicant: InnoLux Corporation, Miao-Li County (TW)

(72) Inventors: Ming-Cheng Hsieh, Miao-Li County (TW); Li-Wei Sung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/820,973

(22) Filed: Aug. 19, 2022

(65) Prior Publication Data
US 2023/0111498 A1    Apr. 13, 2023

(30) Foreign Application Priority Data

Sep. 30, 2021   (CN) ............................ 202111158653.9

(51) Int. Cl.
| | |
|---|---|
| *G06F 3/044* | (2006.01) |
| *G06F 3/01* | (2006.01) |
| *G06F 3/041* | (2006.01) |
| *H03K 17/96* | (2006.01) |

(52) U.S. Cl.
CPC .............. *G06F 3/0443* (2019.05); *G06F 3/016* (2013.01); *G06F 3/0416* (2013.01); *H03K 17/96* (2013.01)

(58) Field of Classification Search
None
See application file for complete search history.

(56) References Cited

U.S. PATENT DOCUMENTS

| | | | |
|---|---|---|---|
| 10,394,447 B2 | 8/2019 | Kildevaeld | |
| 11,416,081 B1* | 8/2022 | Sinivaara | ........... G06F 3/03547 |

\* cited by examiner

*Primary Examiner* — Duane N Taylor Jr
(74) *Attorney, Agent, or Firm* — McClure, Qualey & Rodack, LLP

(57) ABSTRACT

An electronic device is provided, including a functional layer, a touch layer, and a protective layer. The touch layer includes at least one touch electrode, and is disposed between the functional layer and the protective layer. The protective layer includes a bottom surface and a top surface. The bottom surface faces the touch layer, and the top surface is opposite to the bottom surface. The top surface includes an inner region, an outer region, and a virtual knob portion. The virtual knob portion is disposed between the inner region and the outer region and corresponds to the touch electrode, and at least a portion of the virtual knob portion protrudes from the outer region or is depressed relative to the outer region.

20 Claims, 9 Drawing Sheets

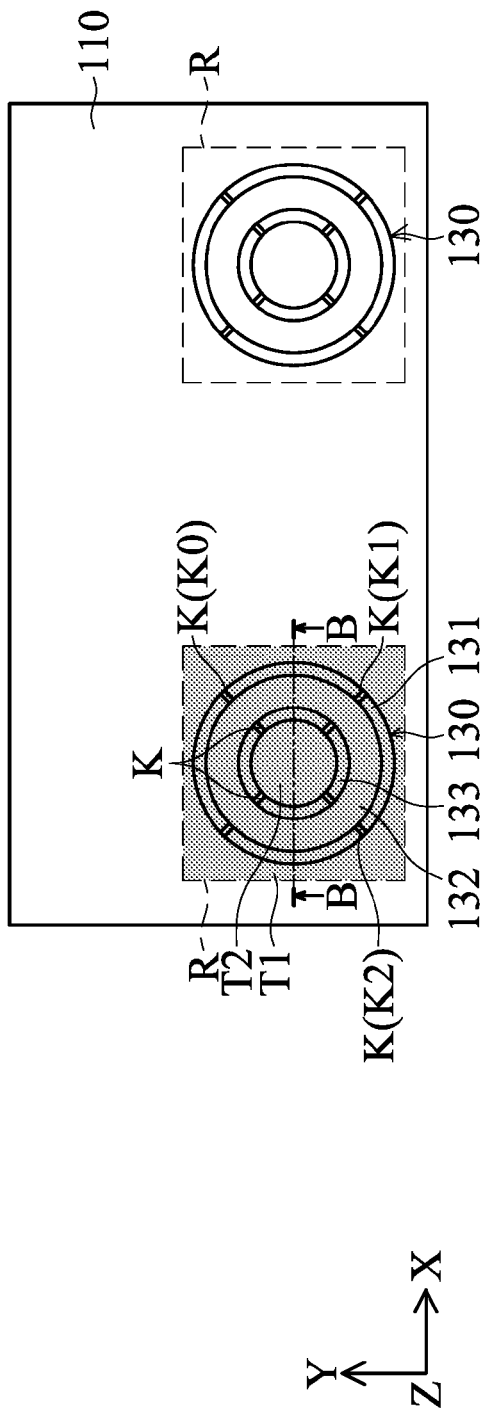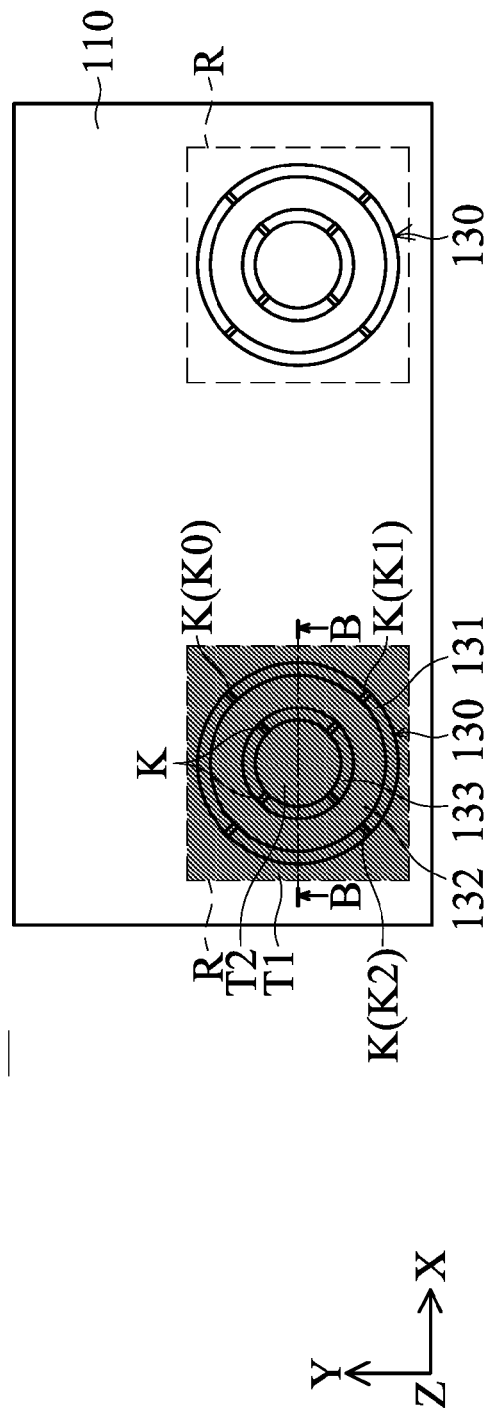

ELECTRONIC DEVICE

CROSS REFERENCE TO RELATED APPLICATIONS

This application claims the benefit of China Patent Application No. 202111158653.9, filed Sep. 30, 2021, the entirety of which is incorporated by reference herein.

BACKGROUND OF THE DISCLOSURE

Field of the Disclosure

The application relates in general to an electronic device, and in particular, to an electronic device having a virtual knob.

Description of the Related Art

The current trend of electronic devices having a display panel (for example, in televisions, tablet computers, and smartphones) is moving towards large screens and narrow bezels. In some electronic devices, a knob is needed to facilitate the user's operation of the device. However, knob mechanisms are complicated, and it is difficult to assemble one on the screen. Moreover, a knob takes up space on the screen, reducing the available display region. Therefore, how to address the aforementioned problem has become an important issue.

BRIEF SUMMARY OF DISCLOSURE

To address the deficiencies of conventional products, an embodiment of the disclosure provides an electronic device, including a functional layer, a touch layer, and a protective layer. The touch layer includes at least one touch electrode, and is disposed between the functional layer and the protective layer. The protective layer includes a bottom surface and a top surface. The bottom surface faces the touch layer, and the top surface is opposite to the bottom surface. The top surface includes an inner region, an outer region, and a virtual knob portion. The virtual knob portion is disposed between the inner region and the outer region and corresponds to the touch electrode, and at least a portion of the virtual knob portion protrudes from the outer region or is depressed relative to the outer region.

BRIEF DESCRIPTION OF DRAWINGS

The disclosure can be more fully understood by reading the subsequent detailed description and examples with references made to the accompanying drawings, wherein:

FIG. 7 is a cross-sectional view taken along the line B-B in FIG. 6;

FIG. 7A is a schematic diagram represents that the brightness in the virtual knob operating region becomes brighter;

FIG. 7B is a schematic diagram represents that the brightness in the virtual knob operating region becomes darker;

DETAILED DESCRIPTION OF DISCLOSURE

Figure 1:
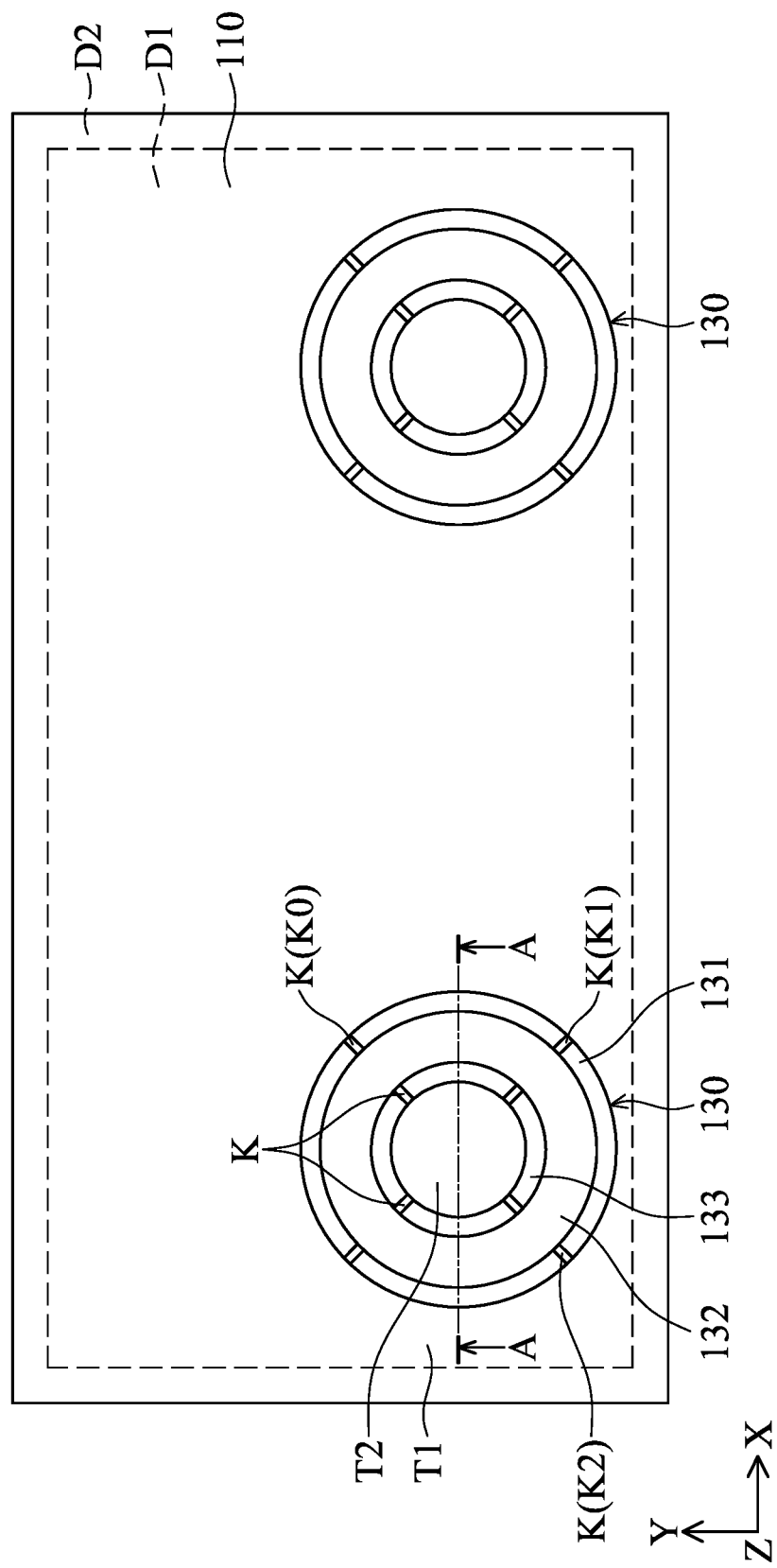
FIG. 1 is a schematic diagram of an electronic device according to an embodiment of the disclosure.

The making and using of the embodiments of the electronic device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to...". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

In addition, in this specification, relative expressions are used. For example, "below" and "above" are used to describe the position of one element relative to another. It should be appreciated that if a device is flipped upside down, an element that is "below" will become an element that is "above".

When the corresponding component (such as layer or area) is referred to "on another component (or the variant thereof)", it may be directly on another component, or other component may exist between them. On the other hand, when the component is referred to "directly on another component (or the variant thereof)", any component does not exist between them. Moreover, when a component is referred to "on another component (or the variant thereof)", the component and the other component has a positional relationship in a top view direction, the component can be disposed above or below the other component, and the positional relationship is based on the orientation of the device.

In some embodiments of the disclosure, terms concerning attachments, coupling and the like, such as "connected", refer to a relationship wherein structures are secured or attached to one another either directly or indirectly through intervening structures, unless expressly described otherwise.

It should be understood that, although the terms "first", "second", etc. can be used herein to describe various elements, layers and/or sections, these elements, layers and/or sections should not be limited by these terms. These terms are only used to distinguish one element layer or section from another element, layer or section. Thus, a first element, layer or section discussed below could be termed a second element, layer or section without departing from the teachings of the present disclosure. For brevity, the terms "first", "second", etc. may not be used in the specification. The first element and/or the second element in claims can refer to any element that meets the description in the specification without departing from the spirit and scope of the invention as defined by the appended claims.

The terms "about" and "substantially" typically mean +/-15% of the stated value, for example, +/-10%, +/-5%, +/-3%, +/-2%, +/-1%, or +/-0.5% of the stated value. The stated value of the present disclosure is an approximate value. When there is no specific description to the terms "about" and "substantially", the stated value includes the meaning of "about" or "substantially". Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise. Moreover, for brevity, some elements can be suitably omitted in the figures.

Figure 2:
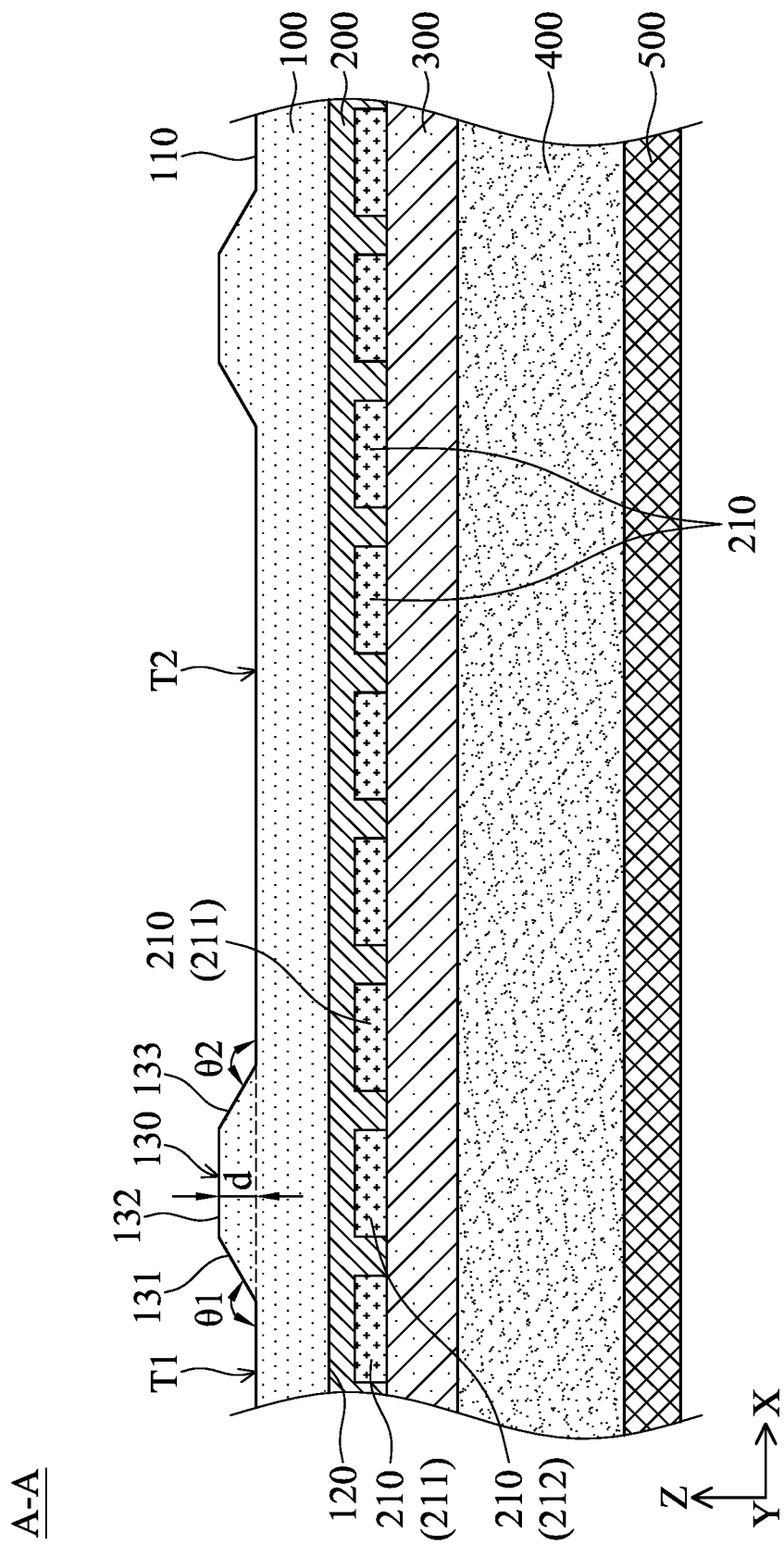
FIG. 2 is a cross-sectional view taken along the line A-A in FIG. 1.

FIG. 1 is a schematic diagram of an electronic device 10 according to an embodiment of the disclosure, and FIG. 2 is a cross-sectional view taken along the line A-A in FIG. 1. Referring to FIG. 1 and FIG. 2, the electronic device 10 of the disclosure can be a display, and can be applied to a public information display (PID), a television, a monitor, a tablet computer, a smart phone, a smart watch, or a car display, but it is not limited thereto.

The electronic device 10 primarily includes a protective layer 100, a touch layer 200, a functional layer 300, a display assembly 400, and an oscillator 500. The touch layer 200, the functional layer 300, and the display assembly 400 are disposed between the protective layer 100 and the oscillator 500, the functional layer 300 is disposed between the touch layer 200 and the display assembly 400, and the touch layer 200 is disposed between the protective layer 100 and the functional layer 300.

For example, the protective layer 100 can be a glass substrate and have a top surface 110 and a bottom surface 120. The bottom surface 120 faces the touch layer 200, and the bottom surface 120 is opposite to the top surface 110. In this embodiment, the top surface 110 can be divided into a virtual knob portion 130, an outer region T1, and an inner region T2. The virtual knob portion 130 includes an annular structure.

As shown in FIG. 2, the virtual knob portion 130 protrudes relative to the outer region T1 and the inner region T2, and has an outer surface 131, a contact surface 132, and an inner surface 133. The contact surface 132 is located between the outer surface 131 and the inner surface 133. The outer surface 131 is connected to the contact surface 132 and the outer region T1, and the outer surface 131 is disposed between the contact surface 132 and the outer region T1. The inner surface 133 is connected to the contact surface 132 and the inner region T2, and the inner surface 133 is disposed between the contact surface 132 and the inner region T2. The outer surface 131 is inclined relative to the outer surface T1, the inner surface 133 is inclined relative to the inner surface T2, and the contact surface 132 is substantially parallel to the outer region T1 (or the inner region T2). For example, an angle θ1 between the outer surface 131 and the outer region T1 can be ranged in 120 degrees to 150 degrees, and an angle θ2 between the inner surface 133 and the inner region T2 can be ranged in 120 degrees to 150 degrees, so as to facilitate the user to operate. In this embodiment, the angle θ1 between the outer surface 131 and the outer region T1 is the same as the angle θ2 between the inner surface 133 and the inner region T2, and the distance d between the contact surface 132 and the outer region T1 (or the inner region T2) is from 2 millimeters to 5 millimeters. The direction for measuring the distance d can be substantially parallel to the normal direction of the outer region T1, but it is not limited thereto.

In some embodiments, the contact surface 132 of the virtual knob portion 130 can be touched to further adjust the device system function (such as the volume or the temperature). In other embodiments, the outer surface 131, the contact surface 132, and the inner surface 133 can be touched to further adjust the device system function (such as the volume or the temperature), but it is not limited thereto.

As shown in FIG. 1, the outer surface 131 and the inner surface 133 respectively form a plurality of scale portions K, such as protrusions or depressions. Therefore, when the user contacts the outer surface 131 or the inner surface 133 and moves along the aforementioned surface, he or she can confirm the contacting position on the outer surface 131 or the inner surface 133 according to the scale portions K. In this embodiment, the scale portions K on the outer surface 131 are arranged at equal intervals, and the scale portions K on the inner surface 133 are arranged at equal intervals, but it is not limited thereto.

Moreover, in this embodiment, since the virtual knob portion 130 includes the annular structure, the inner region T2 is surrounded by the virtual knob portion 130.

For example, the virtual knob portion 130 can be formed by attaching the transparent glass sheet or plastic sheet on the protective layer 100, but it is not limited thereto. In some embodiments, the virtual knob portion 130 can be formed by thermocompression, etching, or cutting during the manufacture of the protective layer 100.

Referring to FIG. 1 and FIG. 2, the touch layer 200 includes a plurality of touch electrodes 210. In detail, the touch electrodes 210 includes a plurality of driving electrodes 211 (Transmissive Line, TX) and a plurality of receiving electrodes 212 (Receive Line, RX), respectively configured to output the electric field and receive the electric field. The position of at least one of the touch electrodes 210 corresponds to the position of the virtual knob portion 130. In this embodiment, at least one of the touch electrodes 210 corresponds to the inner region T2.

The functional layer 300 is disposed below the touch layer 200. For example, the functional layer 300 can be a color filter (CF) or a supporting layer, but it is not limiter thereto. The supporting layer can be made of glass or another suitable supporting material. The display assembly 400 is disposed below the functional layer 300. The display assembly 400 can include components, such as liquid crystal, or a backlight module, but it is not limited thereto.

In some embodiments, the touch layer 200 can be formed on the functional layer by a photolithography or an attaching process, but it is not limited thereto.

For example, the backlight module in the display assembly 400 can be a direct-type backlight module or a side-light type backlight module. The luminous body in the backlight module can include a light-emitting diode (LED), a cold cathode fluorescent lamp (CCFL), a fluorescence, a phosphor, or other luminous body with suitable type. The light-emitting diode can include an inorganic light-emitting diode, an organic light-emitting diode (OLED), a mini LED, a micro LED, a quantum dots light-emitting diode (QLED or QD-LED), other suitable light-emitting diode, or the combination thereof, but it is not limited thereto.

The oscillator 500 is disposed below the display assembly 400, and the position of the virtual knob portion 130 corresponds to that of the oscillator 500. In some embodiments, the position of the virtual knob portion 130 does not correspond to that of the oscillator 500. It should be noted that, the term "correspond" herein can be referred as the components are at least partially overlapped each other in the normal direction of the surface of the protective layer 100 (for example, in the Z-axis). For example, in the top view, the virtual knob portion 130 and the oscillator 500 can be at least partially overlapped each other.

In some other embodiments, the virtual knob portion 130 and the oscillator 500 are not overlapped. In some embodiments, when the user touches the virtual knob portion 130, the oscillation is caused in the region of the virtual knob portion 130. In some other embodiments, when the user touches the virtual knob portion 130, the whole display oscillates, that is, the outer region T1, the inner region T2, and the virtual knob portion 130 oscillate.

Figure 3:
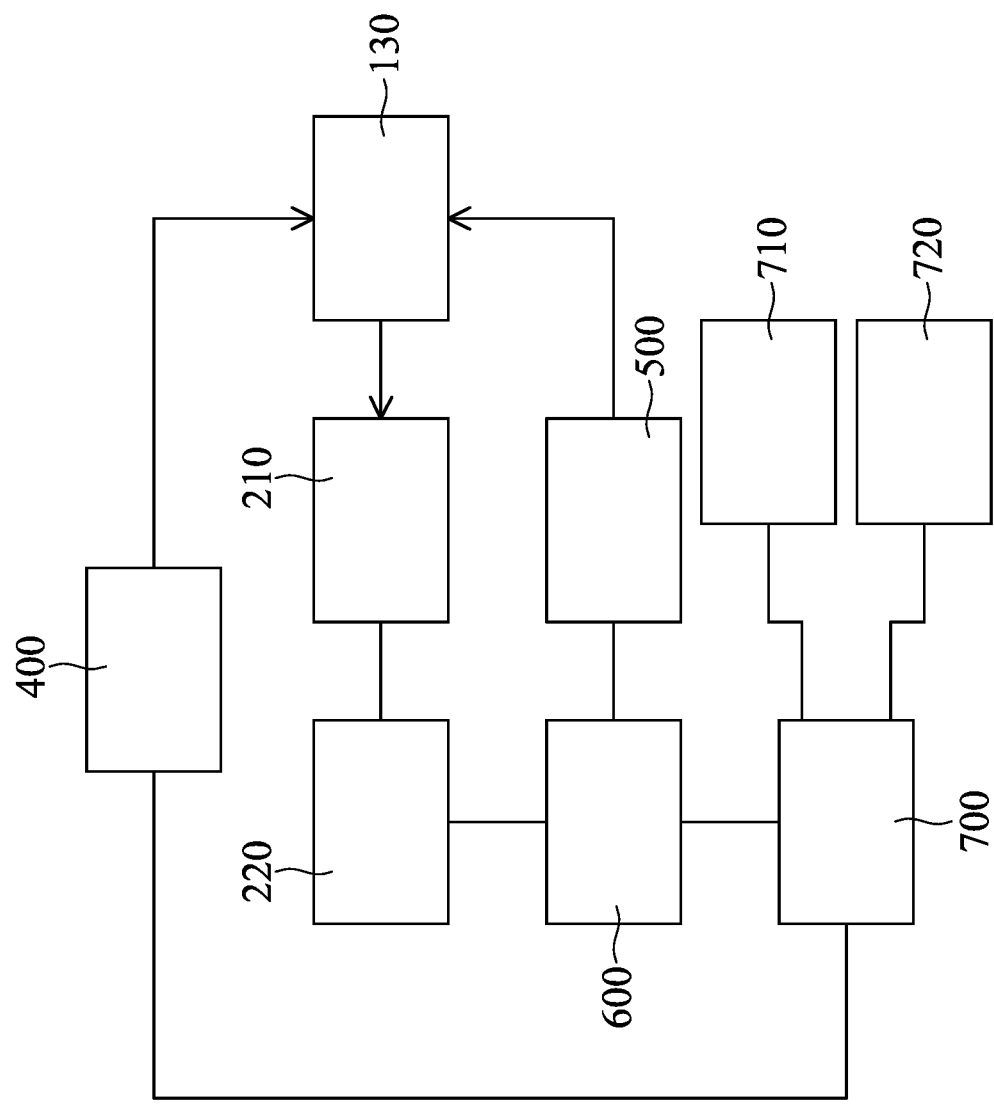
FIG. 3 is a schematic diagram of some components in the electronic device according to some embodiments of the disclosure.

Referring to FIG. 1 to FIG. 3, in this embodiment, the touch layer 200 can further include a touch IC 220, and the electronic device 10 further includes a processor 600, a head unit 700, and a plurality of systems. The touch IC 220 is electrically connected to the touch electrode 210. The processor 600 is electrically connected to the touch IC220, the oscillator 500, and the head unit 700. The head unit 700 is electrically connected to the display assembly 400 and the aforementioned systems. The systems can include an air conditioning system 710 and/or a sound system 720, but it is not limited thereto.

When the user uses the electronic device 10, he or she can use an object (such as a finger or a stylus pen) to contact the outer surface 131 and the inner surface 133 of the virtual knob portion 130, and move long the outer surface 131 and the inner surface 133. When the touch electrode 210 detects the aforementioned movement by the variation of the electric field, the touch IC 220 can transmit an output signal to the processor 600, and the processor 600 can transmit a control signal to the aforementioned system(s) according to the output signal to control the system(s).

For example, when the object contacts the outer surface 131 of the virtual knob portion 130 and moves along the outer surface 131 in a clockwise direction, the processor 600 can transmit the control signal to control the air conditioning system 710 to enhance the heat dissipating efficiency (for example, to increase the rotation speed of the fan in the electronic device 10). When the object contacts the outer surface 131 of the virtual knob portion 130 and moves along the outer surface 131 in a counterclockwise direction, the processor 600 can transmit the control signal to control the air conditioning system 710 to reduce the heat dissipating efficiency. In another embodiment, when the object contacts the inner surface 133 of the virtual knob portion 130 and moves along the inner surface 133 in the clockwise direction, the processor 600 can transmit the control signal to control the sound system 720 to increase the volume of the sound system 720. When the object contacts the inner surface 133 of the virtual knob portion 130 and moves along the inner surface 133 in the counterclockwise direction, the processor 600 can transmit the control signal to control the sound system 720 to reduce the volume of the sound system 720

When the object contacts the outer surface 131 or the inner surface 133 of the virtual knob portion 130 and moves to one or more predetermined positions, the oscillator 500 can oscillate so that the user can feel a haptic feedback that indicates whether the operation is completed or not.

For example, when the object contacts the outer surface 131 of the virtual knob portion 130 and moves along the outer surface 131 from the scale portion K0 to the scale portion K1, the oscillator 500 can oscillate. When the object contacts the outer surface 131 of the virtual knob portion 130 and moves along the outer surface 131 from the scale portion K1 to the scale portion K2, the oscillator 500 can oscillate again.

It should be noted that, in some embodiments, in order to let the user realizing the operation state more convenient, when the object contacts different positions of the virtual knob portion 130, the oscillator 500 can create different oscillation effects. The different oscillation effects can include different frequencies, different amplitudes, different numbers of oscillation, or different oscillation wave patterns, but it is not limited thereto. For example, the oscillator 500 can create a smaller oscillation when the object moves to the scale portion K1, and can create a larger oscillation when the object moves to the scale portion K2.

When the object contacts the virtual knob portion 130 and moves in different directions, different oscillation effects can be also created to let the user realizing the operation state more convenient. For example, when the object contacts the outer surface 131 or the inner surface 133 and moves clockwise (the first direction), the oscillator 500 can create a first oscillation effect, and when the object contacts the outer surface 131 or the inner surface 133 and moves counterclockwise (the second direction), the oscillator 500 can create a second oscillation effect that is different from the first oscillation effect.

The contact surface 132 of the virtual knob portion 130 and the inner region T2 can serve as the switch in any one of the aforementioned systems. For example, when the object contacts the contact surface 132, the air conditioning system 710 can open or close, and when the object contacts the inner region T2, the sound system 720 can open or close, but it is not limited thereto. In some embodiments, the contact surface 132 and/or the inner region T2 can be the switch for the backlight module in the display assembly 400.

When the object contacts the contact surface 132 and the inner region T2, the oscillator 500 can oscillate to provide haptic feedback to the user. The oscillation effects caused by the object contacting the contact surface 132 and the inner region T2 can be different, and can be also different from the oscillation effects caused by the object contacting the outer surface 131 and the inner surface 133, to help the user to distinguish between them.

Figure 4:
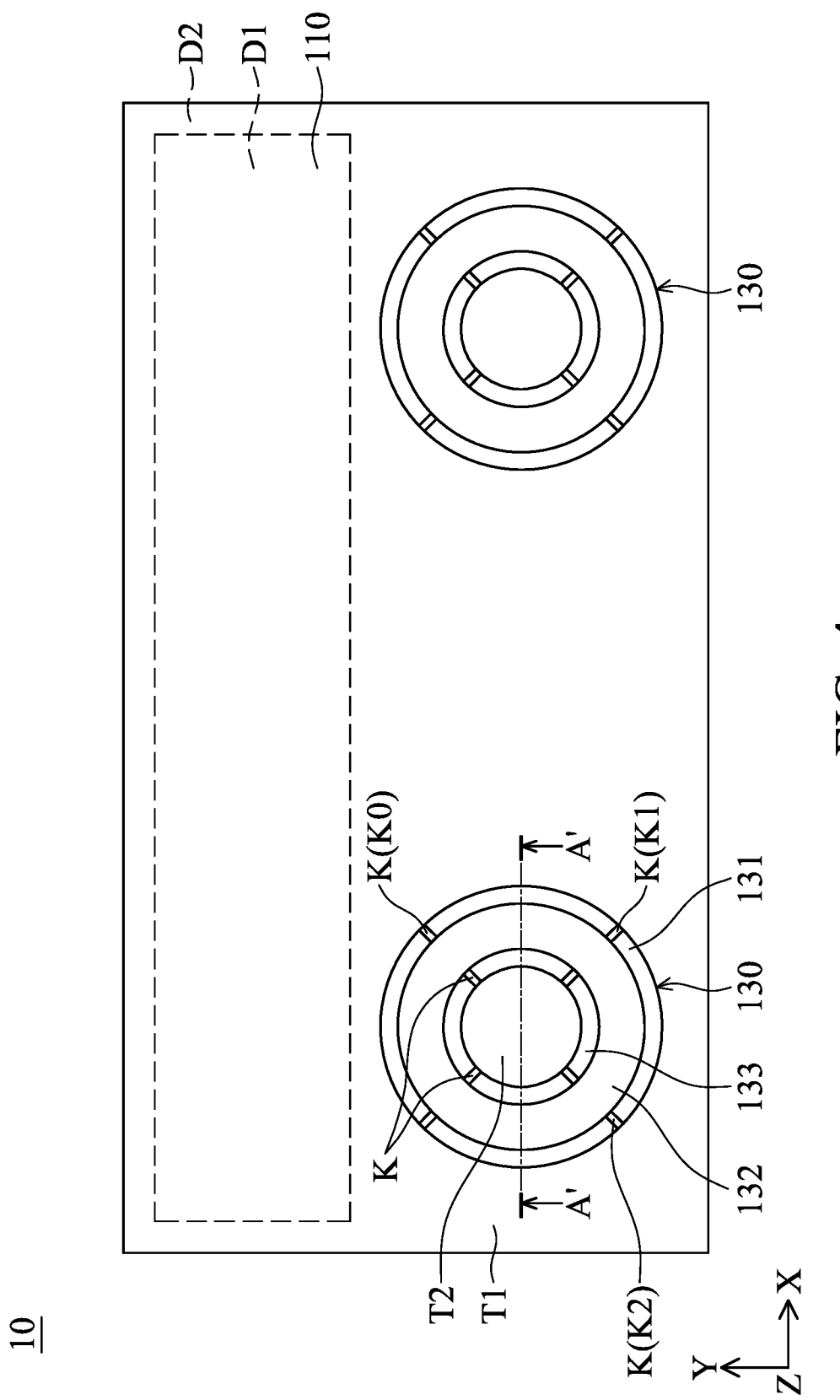
FIG. 4 is a schematic diagram of an electronic device according to another embodiment of the disclosure.

As shown in FIG. 1, the electronic device 10 can be divided into a display region D1 and a non-display region D2. The image provided from the display assembly 400 can be shown in the display region D1. The virtual knob portion 130 in this embodiment is disposed in the display region D1. Since the virtual knob portion 130 includes transparent material, the virtual knob portion 130 does not shield the image, and the electronic device 10 can include the larger display region D1. As shown in FIG. 4, in some embodiment, the virtual knob portion 130 can be disposed in the non-display region D2 of the electronic device 10.

In some embodiments, a surface treatment can be applied to the outer surface 131, the contact surface 132, and/or the inner surface 133 of the virtual knob portion 130, so that the roughness of the treated surface(s) (the roughness of the treated outer surface 131, the roughness of the treated contact surface 132, and/or the roughness of the treated inner surface 133) is greater than the roughness of the outer region T1 and the inner region T2. Thus, the user can more easily confirm that the object is in contact with the virtual knob portion 130.

The "roughness" can be an arithmetic average roughness (Ra), that is, the arithmetic average of the deviation of the centerline from the shape over the length of the selected portion, but it is not limited thereto.

Figure 5:
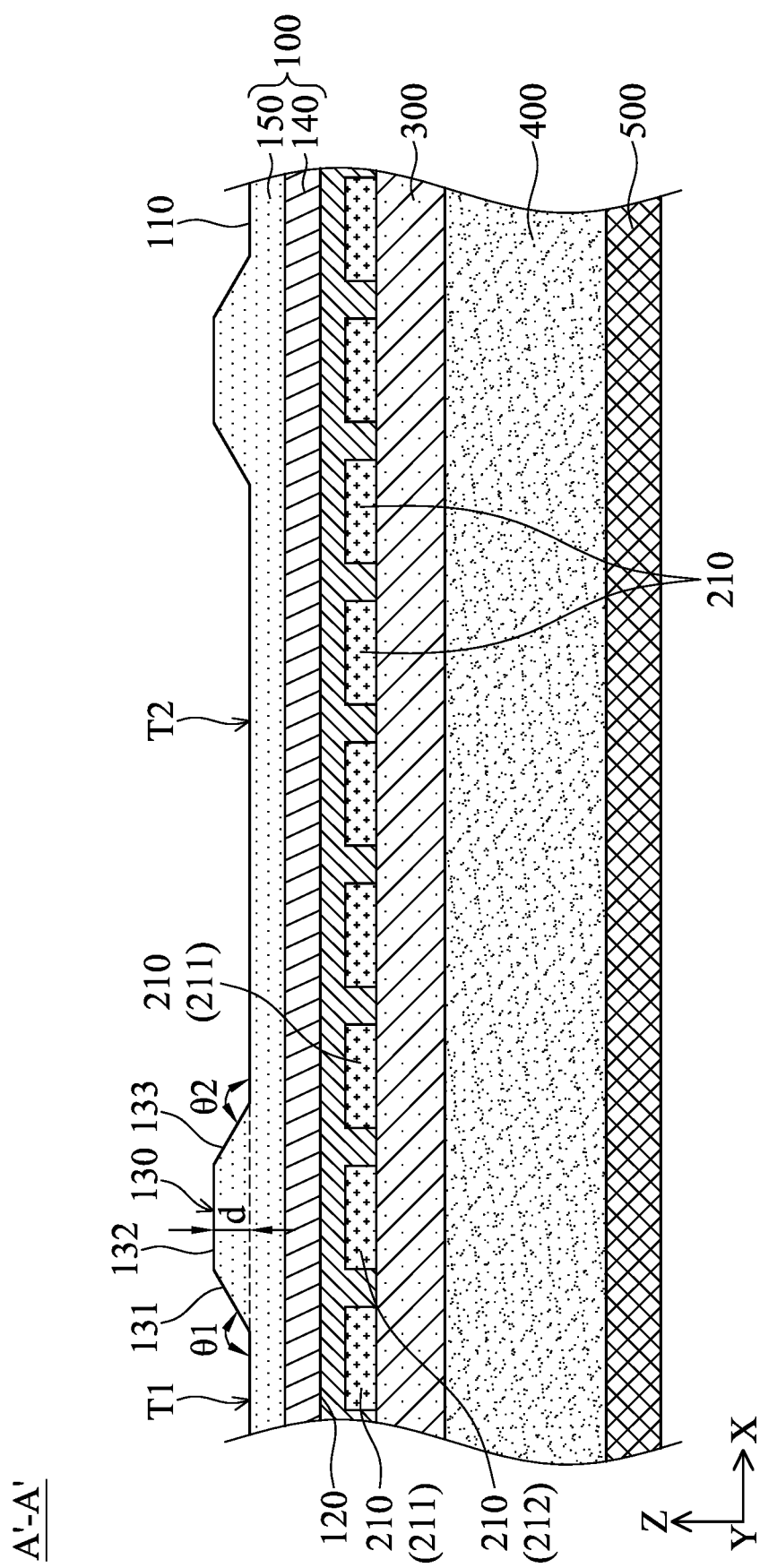
FIG. 5 is a cross-sectional view taken along the line A'-A' in FIG. 4.

FIG. 5 is a cross-sectional view taken along the line A'-A' in FIG. 4. Referring to FIG. 5, in another embodiment of the disclosure, the protective layer 100 is a composite layer including a substrate 140 and an upper layer. The substrate 140 is disposed between the upper layer 150 and the touch layer 200, and the virtual knob portion 130 is formed on the upper layer 150. For example, the substrate 140 can be made of glass, and the upper layer 150 can be a glass sheet or a plastic sheet, but it is not limited thereto.

Figure 6:
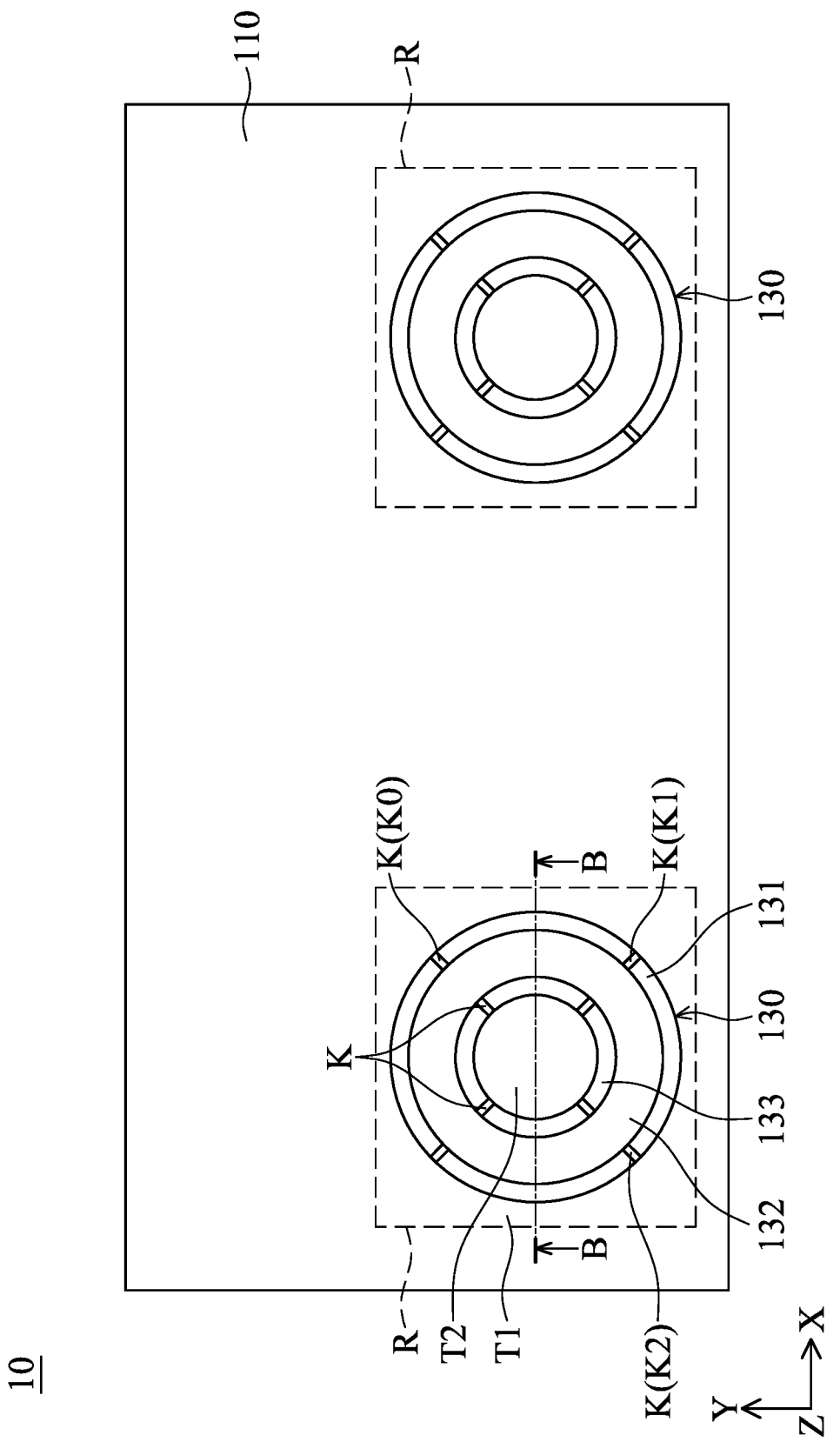
FIG. 6 is a schematic diagram of an electronic device according to another embodiment of the disclosure.

FIG. 6 is a schematic diagram of an electronic device 10 according to another embodiment of the disclosure, and FIG. 7 is a cross-sectional view taken along the line B-B in FIG. 6. As shown in FIG. 6 and FIG. 7, the difference between the electronic device 10 of this embodiment and the electronic device 10 in FIGS. 1-3 is in that, the top surface 110 of the protective layer 100 further includes a virtual knob operating region R, and the virtual knob portion 130 is disposed in the virtual knob operating region R.

The top surface 110 in the virtual knob operating region R protrudes relative to the top surface 110 outside the virtual knob operating region R. Therefore, when the object slides along the top surface 110, it can be easily sensed when the object enters the virtual knob operating region R.

In this embodiment, when the object contacts the top surface 110 and moves from the outer of the virtual knob operating region R into the virtual knob operating region R, the oscillator 500 oscillates and the brightness in the virtual knob operating region R changes (for example, the brightness therein can become brighter than the brightness of the outer of the virtual knob operating region R, as shown in FIG. 7A). When the object contacts the top surface 110 and moves from the virtual knob operating region R to the outer of the virtual knob operating region R, the oscillator 500 oscillates and the brightness in the virtual knob operating region R changes (for example, the brightness therein can become darker than the brightness of the outer of the virtual knob operating region R, as shown in FIG. 7B). Similarly, the oscillation effect of the oscillation created by the movement of the object from the outer of the virtual knob operating region R to the virtual knob operating region R can be different from the oscillation effect of the oscillation created by the movement of the object from the virtual knob operating region R to the outer of the virtual knob operating region R.

In some embodiments, the top surface 110 in the virtual knob operating region R can be coplanar to the top surface 110 outside the virtual knob operating region R, or the top surface 110 in the virtual knob operating region R can be smoothly connected to the top surface 110 outside the virtual knob operating region R, so as to maintain the smooth surface of the electronic device 10. In these embodiments, the user can confirm whether the object has entered the virtual knob operating region R using the oscillation in the virtual knob operating region R and/or the variation in brightness.

Figure 8:
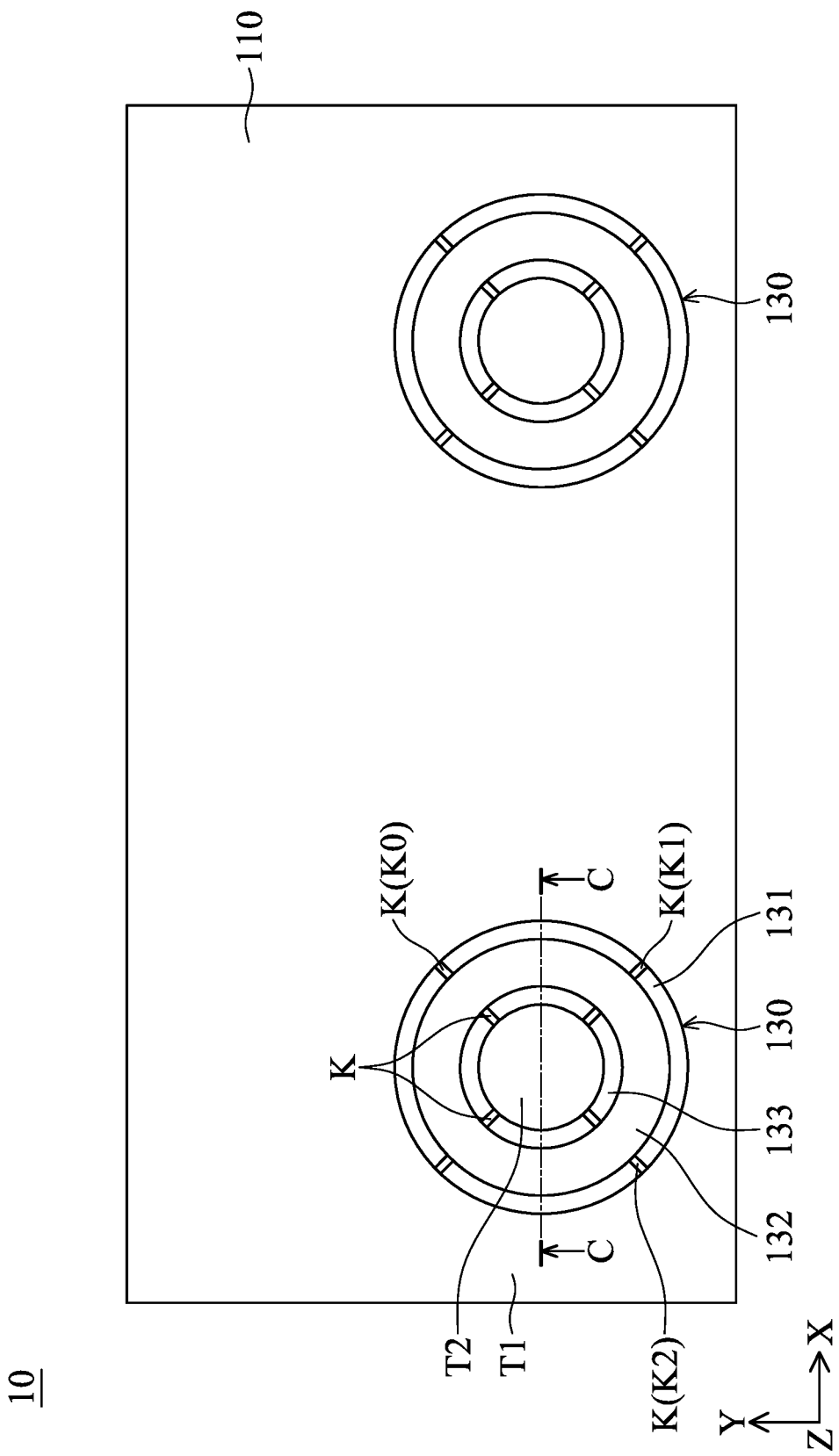
FIG. 8 is a schematic diagram of an electronic device according to another embodiment of the disclosure.
Figure 9:
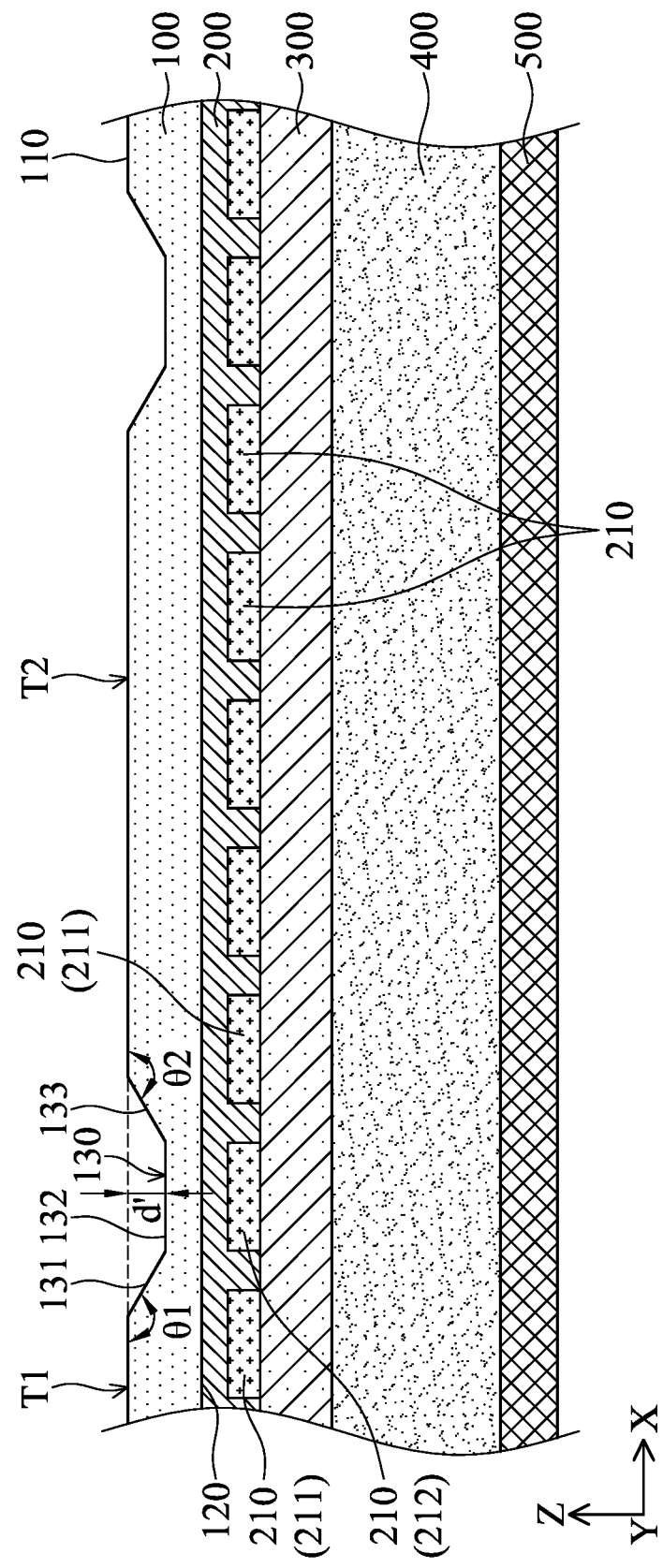
FIG. 9 is a cross-sectional view taken along the line C-C in FIG. 8.

FIG. 8 is a schematic diagram of an electronic device 10 according to another embodiment of the disclosure, and FIG. 9 is a cross-sectional view taken along the line C-C in FIG. 8. As shown in FIG. 8 and FIG. 9, the difference between the electronic device 10 of this embodiment and the electronic device 10 in FIGS. 1-3 is in that, the virtual knob portion 130 is a depression formed on the top surface 110 of the protective layer 100.

The virtual knob portion 130 has an outer surface 131, a contact surface 132, and an inner surface 133. The contact surface 132 is located between the outer surface 131 and the inner surface 133. The outer surface 131 is connected to the contact surface 132 and the outer region T1, and the inner surface 133 is connected to the contact surface 132 and the inner region T2. The outer surface 131 is inclined relative to the outer surface T1, the inner surface 133 is inclined relative to the inner surface T2, and the contact surface 132 is substantially parallel to the outer region T1 (or the inner region T2). For example, an angle θ1 between the outer surface 131 and the outer region T1 can be ranged in 120 degrees to 150 degrees, and an angle θ2 between the inner surface 133 and the inner region T2 can be ranged in 120 degrees to 150 degrees, so as to help the user operate the device. In this embodiment, the angle θ1 between the outer surface 131 and the outer region T1 is the same as the angle θ2 between the inner surface 133 and the inner region T2, and the distance d' between the contact surface 132 and the outer region T1 (or the inner region T2) is from 2 millimeters to 5 millimeters. The direction for measuring the distance d' can be substantially parallel to the normal direction of the outer region T1, but it is not limited thereto.

The outer surface 131 and the inner surface 133 respectively form a plurality of scale portions K. Therefore, when the user contacts the outer surface 131 or the inner surface 133 and moves along the aforementioned surface, he or she can confirm the contacting position on the outer surface 13 or the inner surface 133 according to the scale portions K. In this embodiment, the scale portions K on the outer surface 131 are arranged at equal intervals, and the scale portions K on the inner surface 133 are arranged at equal intervals, but it is not limited thereto.

The virtual knob portion 130 can be formed by thermo-compression, etching, or cutting, but it is not limiter thereto.

The features between the aforementioned embodiments can be used or combined as long as they do not violate or conflict the spirit of the present application.

In summary, an embodiment of the disclosure provides an electronic device, including a functional layer, a touch layer, and a protective layer. The touch layer includes at least one touch electrode, and is disposed between the functional layer and the protective layer. The protective layer includes a bottom surface and a top surface. The bottom surface faces the touch layer, and the top surface is opposite to the bottom surface. The top surface includes an inner region, an outer region, and a virtual knob portion. The virtual knob portion is disposed between the inner region and the outer region and corresponds to the touch electrode, and at least a portion of the virtual knob portion protrudes from the outer region or is depressed relative to the outer region.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the disclosure has been described by way of example and in terms of preferred embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electronic device, comprising:
   a functional layer;
   a touch layer, comprising at least one touch electrode; and
   a protective layer, wherein the touch layer is disposed between the functional layer and the protective layer, and the protective layer comprises:
   a bottom surface, facing the touch layer; and
   a top surface, opposite to the bottom surface and comprising:
   an inner region;
   an outer region; and
   a virtual knob portion, disposed between the inner region and the outer region and corresponding to the touch electrode, wherein at least a portion of the virtual knob portion protrudes from the outer region or is depressed relative to the outer region, wherein the virtual knob portion surrounds the inner region, and the inner region is coplanar with the outer region.

2. The electronic device as claimed in claim 1, wherein the protective layer is a composite layer comprising a substrate and an upper layer, the substrate is disposed between the upper layer and the touch layer, and the virtual knob portion is formed on the upper layer.

3. The electronic device as claimed in claim 2, wherein the upper layer comprises glass or plastic.

4. The electronic device as claimed in claim 1, wherein the touch electrode enables the transmission of an output signal to a processor, and the processor transmits a control signal to a system according to the output signal.

5. The electronic device as claimed in claim 1, wherein the virtual knob portion comprises an annular structure.

6. The electronic device as claimed in claim 1, wherein the virtual knob portion comprises an outer surface and a contact surface, the outer surface is connected to the contact surface and the outer region, and the outer surface is inclined relative to the outer region.

7. The electronic device as claimed in claim 6, wherein a plurality of scale portions are formed on the outer surface.

8. The electronic device as claimed in claim 7, wherein the distances between the adjacent scale portions are the same.

9. The electronic device as claimed in claim 6, wherein the contact surface is parallel to the top surface.

10. The electronic device as claimed in claim 6, wherein the virtual knob portion further comprises an inner surface that is connected to the contact surface and the inner region, the contact surface is disposed between the outer surface and the inner surface, and the inner surface is inclined relative to the inner region.

11. The electronic device as claimed in claim 10, wherein a plurality of scale portions are formed on the inner surface.

12. The electronic device as claimed in claim 10, wherein the roughness of the inner surface is greater than the roughness of the inner region.

13. The electronic device as claimed in claim 10, wherein an angle between the inner surface and the inner region is ranged in 120 degrees to 150 degrees.

14. The electronic device as claimed in claim 6, wherein an angle between the outer surface and the outer region is ranged in 120 degrees to 150 degrees.

15. The electronic device as claimed in claim 6, wherein a distance between the contact surface and the outer region is from 2 millimeters to 5 millimeters.

16. The electronic device as claimed in claim 6, wherein the roughness of the outer surface is greater than the roughness of the outer region.

17. The electronic device as claimed in claim 1, wherein the touch layer comprises a plurality of touch electrodes, the virtual knob portion surrounds the inner region, and one of the touch electrodes corresponds to the inner region.

18. The electronic device as claimed in claim 1, wherein the top surface comprises a virtual knob operating region, and the virtual knob portion is disposed in the virtual knob operating region, wherein the top surface in the virtual knob operating region protrudes from the top surface outside the virtual knob operating region.

19. The electronic device as claimed in claim 1, wherein the top surface comprises a virtual knob operating region, and the virtual knob portion is disposed in the virtual knob operating region, wherein the brightness in the virtual knob operating region is higher than the brightness outside the virtual knob operating region.

20. The electronic device as claimed in claim 1, wherein the electronic device further comprises an oscillator corresponding to the virtual knob portion.

* * * * *